United States Patent
Kondo

(10) Patent No.: US 8,659,047 B2
(45) Date of Patent: Feb. 25, 2014

(54) LIGHT EMITTING DEVICE AND MANUFACTURING METHOD THEREOF

(75) Inventor: Ryosuke Kondo, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 145 days.

(21) Appl. No.: 13/104,259

(22) Filed: May 10, 2011

(65) Prior Publication Data

US 2011/0278602 A1    Nov. 17, 2011

(30) Foreign Application Priority Data

May 13, 2010    (JP) .................................. 2010-111302

(51) Int. Cl.
*H01L 33/00*    (2010.01)

(52) U.S. Cl.
USPC ...... 257/99; 257/100; 257/707; 257/E33.057; 257/E33.075

(58) Field of Classification Search
USPC ......... 257/79, 81, 91, 99, 100, 706, 707, 712, 257/E33.057, E33.075
See application file for complete search history.

(56) References Cited

U.S. PATENT DOCUMENTS

| | | | | |
|---|---|---|---|---|
| 6,501,103 | B1* | 12/2002 | Jory et al. | 257/100 |
| 8,044,418 | B2* | 10/2011 | Loh et al. | 257/98 |
| 2007/0069231 | A1* | 3/2007 | Namioka | 257/99 |

FOREIGN PATENT DOCUMENTS

JP    2007-129062 A    5/2007

* cited by examiner

*Primary Examiner* — Tuan N. Quach
(74) *Attorney, Agent, or Firm* — Holtz, Holtz, Goodman & Chick PC

(57) ABSTRACT

A light emitting device includes a substrate having an element mounting area in a principal surface thereof. The light emitting device also includes at least one light emitting element mounted in the element mounting area of the substrate. The light emitting device also includes a heat transfer member provided on the substrate. The heat transfer member has a thermal conductivity different from thermal conductivity of the substrate so as to form uneven thermal resistance distribution in the element mounting area. Thermal resistance in a heat radiation path through the substrate for release of heat emitted from the light emitting element changes with the mounting position of the light emitting element.

8 Claims, 9 Drawing Sheets

LIGHT EMITTING DEVICE AND MANUFACTURING METHOD THEREOF

BACKGROUND OF THE INVENTION

1. Field of the Invention

The present invention relates to a light emitting device and a manufacturing method thereof and particularly to a light emitting device having LED (light emitting diode) elements mounted thereon and a manufacturing method thereof.

2. Description of the Related Art

Various types of light emitting devices, which have LED elements mounted thereon, are known in the art. One of them is a single-chip-type light emitting device. In the single chip configuration, one LED element is mounted in one package. Another type is a multi-chip configuration that has a plurality of LED elements mounted in one package. Still another type is a light emitting device that has red, green and blue LED elements in a single package. This type is called RGB three-in-one package.

For example, Japanese Patent Application Publication (Kokai) No. 2007-129062 discloses an LED light source device including resistors connected in parallel with LED elements. This LED light source device adjusts the resistance of the resistors to make the brightness or emission spectrum of the LED elements constant. This compensates for variations in brightness between the LED elements.

Because the emission brightness of LED elements depends on the crystallinity of their semiconductor epitaxial layer, it is difficult to make the emission brightness of the LED elements even all the time. Thus, as to the single-chip-type light emitting devices that have one LED element mounted in each package, variations in brightness occur between the light emitting devices. As to the multi-chip-type light emitting devices that have a plurality of LED elements mounted in one package, brightness unevenness occurs in one light emitting device. As to white LEDs of the RGB three-in-one package type, the brightness ratio of R:G:B cannot be an appropriate ratio, and thus white light is different in tone from one light emitting device to another light emitting device. As to white LEDs that are constituted by a combination of a blue LED and a fluorescent substance, white light is different in tone from one light emitting device to another light emitting device.

SUMMARY OF THE INVENTION

One object of the present invention is to provide a light emitting device capable of reducing variations in brightness or emission color between light emitting devices, or brightness unevenness in the light emitting device due to variations in emission brightness between LED elements.

Another object of the present invention is to provide a manufacturing method for such light emitting device.

According to one aspect of the present invention, there is provided a light emitting device that includes a substrate having an element mounting area in a principal surface thereof (e.g., an upper surface of the substrate). The light emitting device also includes at least one light emitting element provided in the element mounting area of the substrate. The light emitting device also includes a heat transfer member provided on the substrate. The heat transfer member has thermal conductivity different from thermal conductivity of the substrate so as to form uneven thermal resistance distribution in the element mounting area. Thermal resistance in a heat radiation path (heat release path) through the substrate for release of heat emitted from the light emitting element changes with (depends on) the mounting position of the light emitting element concerned.

The thermal resistance of the heat radiation path for the heat emitted from the LED element changes according to the mounting position of the LED element in the element mounting area. Hence, the junction temperature of the LED element in operation is adjustable by changing the mounting position of the LED element in the element mounting area, and the emission brightness of the LED element is also adjustable. Therefore, brightness unevenness in a light emitting device due to variations in emission brightness between LED elements can be reduced if the light emitting device has a plurality of LED elements. Also, variations in emission brightness and/or emission color between light emitting devices due to variations in emission brightness between LED elements can be reduced if a plurality of light emitting devices are collectively used.

According to another aspect of the present invention, there is provided a manufacturing method of a light emitting device. The method includes the step of obtaining emission brightness of a light emitting element under predetermined conditions. The method also includes the step of preparing a substrate having a heat transfer member. The heat transfer member provides uneven thermal resistance distribution in an element mounting area of the substrate. The substrate is configured such that thermal resistance in a heat radiation path for release of heat emitted from the light emitting element changes with the mounting position of the light emitting element. The method also includes the step of setting the mounting position of the light emitting element in the element mounting area on the basis of the emission brightness of the light emitting element. The method also includes the step of mounting the light emitting element at the set mounting position on the substrate.

The thermal resistance of the heat radiation path for the heat emitted from the LED element changes according to the mounting position of the LED element in the element mounting area. Hence, the junction temperature of the LED element in operation can be adjusted by changing the mounting position of the LED element in the element mounting area, and the emission brightness of the LED element can be adjusted. Therefore, brightness unevenness in a light emitting device due to variations in emission brightness between LED elements can be reduced. Also, variations in emission brightness and/or emission color between light emitting devices due to variations in emission brightness between LED elements can be reduced.

These and other objects, aspects and advantages of the present invention will become apparent to those skilled in the art from the following detailed description when read and understood in conjunction with the appended claims and drawings.

DETAILED DESCRIPTION OF THE INVENTION

Embodiment 1

Figure 1A:
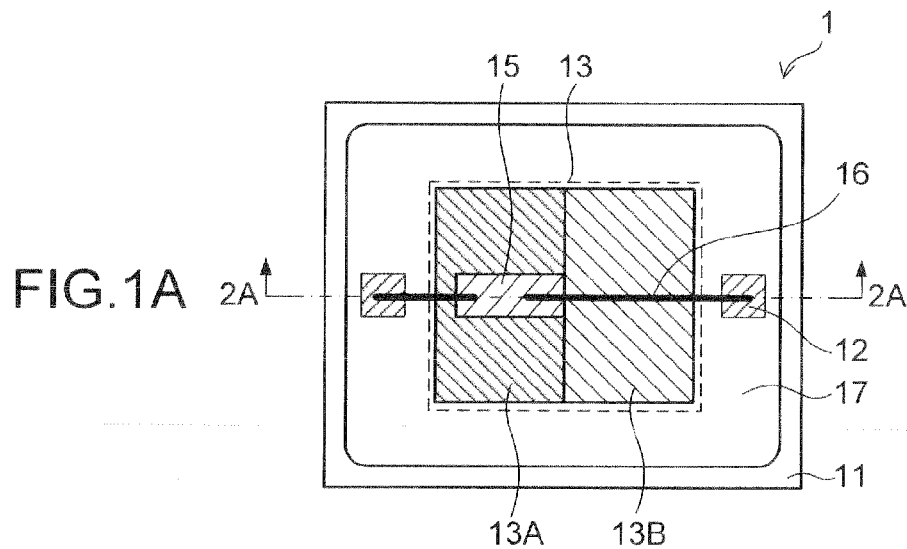
FIG. 1A is a plan view of a light emitting device having a single-chip configuration according to Embodiment 1 of the present invention.
Figure 1B:
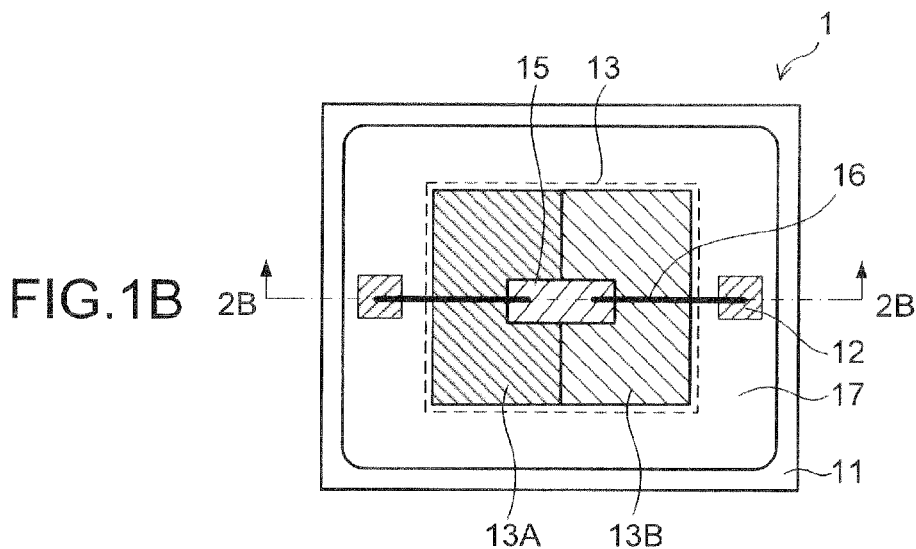
FIG. 1B is similar to FIG. 1A and shows a modification to a light emitting device having the single-chip configuration according to Embodiment 1 of the present invention.
Figure 1C:
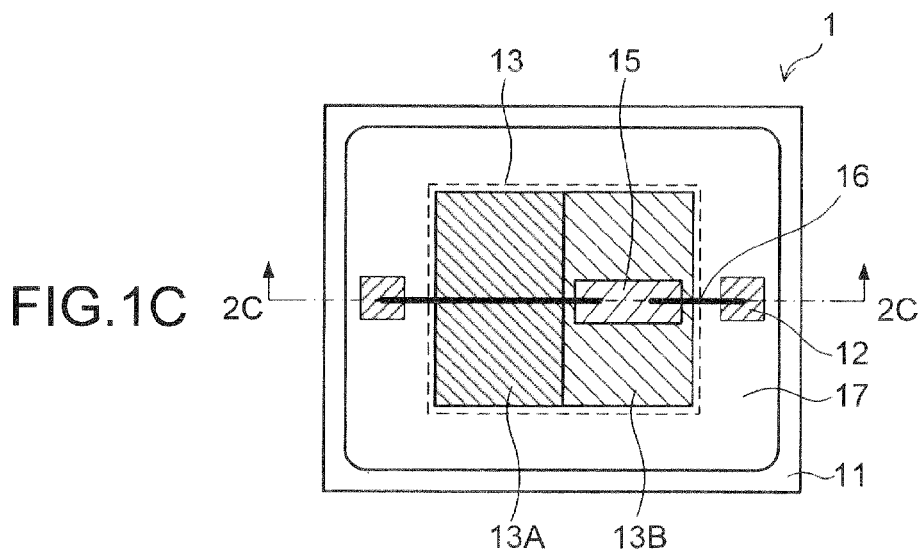
FIG. 1C is also similar to FIG. 1A and shows another modification to a light emitting device having the single-chip configuration according to Embodiment 1 of the present invention.

A light emitting device 1 according to Embodiment 1 of the present invention will be described below with reference to FIGS. 1A-1C and FIGS. 2A-2C. FIGS. 1A to 1C are plan views of the light emitting device 1 as viewed from the light emission surface side.

Figure 2A:
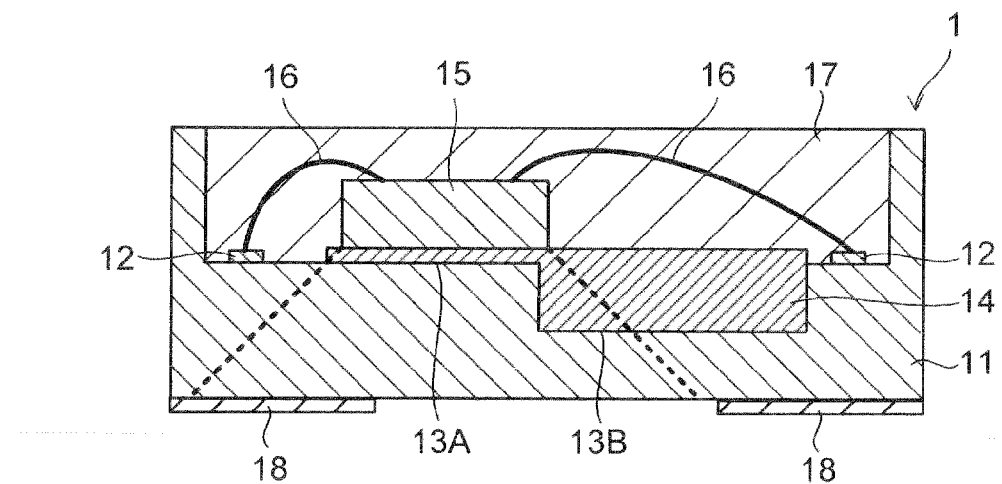
FIG. 2A is a cross-sectional view taken along the line 2A-2A in FIG. 1A.
Figure 2B:
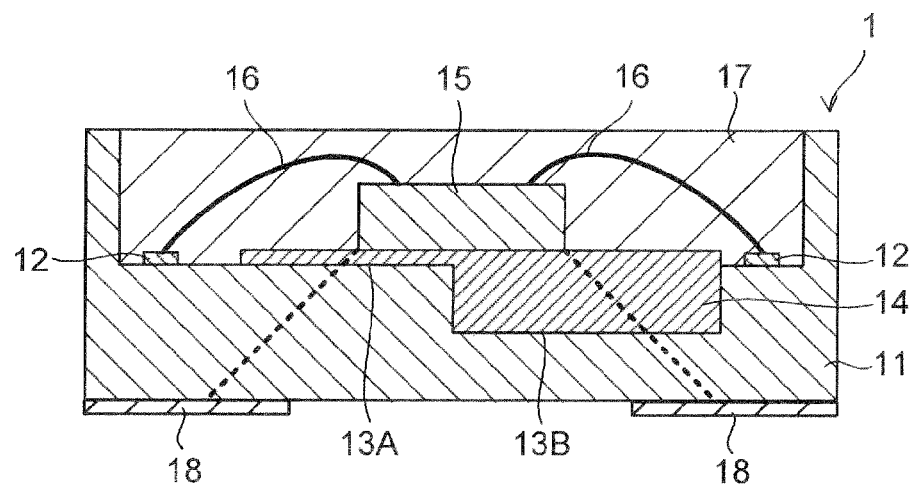
FIG. 2B is a cross-sectional view taken along the line 2B-2B in FIG. 1B.
Figure 2C:
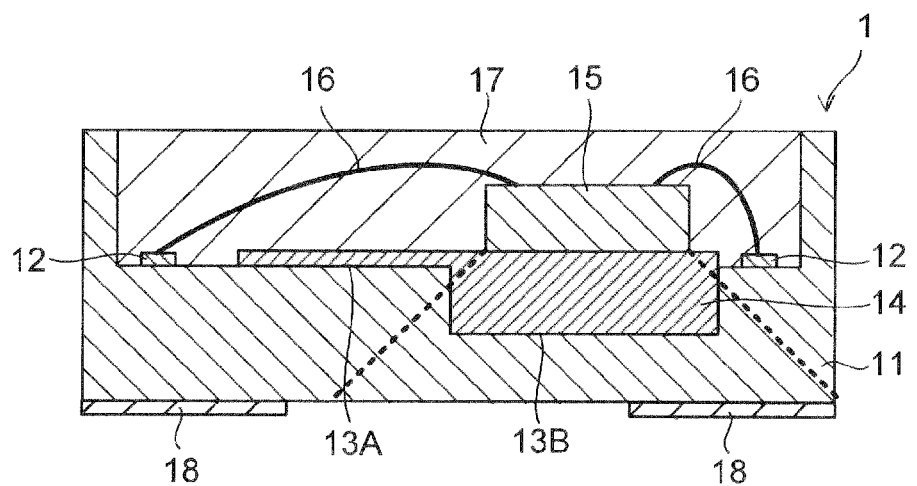
FIG. 2C is a cross-sectional view taken along the line 2C-2C in FIG. 1C.

The light emitting device 1 is of a single-chip configuration with one LED element 15 mounted on a substrate 11. The substrate 11 is a ceramic substrate made of, for example, $Al_2O_3$ (thermal conductivity: 20 W/m·k), and has bonding pads 12 and an element mounting area 13 on its element mounting surface. The LED element 15 is also mounted on the element mounting surface of the substrate 11. The element provision area 13 is defined in the middle of the element mounting surface. The element mounting area 13 has a flat portion 13A defining a flat surface in the principal surface (upper surface) of the substrate 11 and a recess 13B formed in the principal surface of the substrate 11 having a certain depth toward the rear surface (placement surface) side. As shown in FIG. 2A to FIG. 2C, the cross-sectional shape of the recess 13B is rectangular. A die attach material 14 is provided in the recess 13B and also extends on the flat portion 13A. It should be noted that a conductor pattern may be formed on the upper surface of the flat portion 13A and the side and bottom surfaces of the recess 13B to improve the wettability of the die attach material 14.

The die attach material 14 is made of AuSn (thermal conductivity: 50 W/m·k) or the like that is higher in thermal conductivity than $Al_2O_3$. $Al_2O_3$ is the material of the substrate 11. The die attach material 14 covers the flat portion 13A and fills the recess 13B such that the element mounting surface stretching over the flat portion 13A and the recess 13B becomes flat. The die attach material 14 is thicker on the recess 13B than on the flat portion 13A.

The LED element 15 includes an n-type semiconductor layer, a light emitting layer, and a p-type semiconductor layer. An n-electrode and a p-electrode are formed on (in) the surface of the LED element 15. The LED element 15 is provided on the substrate 11 in the element mounting area 13 via the die attach material 14. The n-electrode and the p-electrode are electrically connected to the bonding pads 12 via bonding wires 16. The mounting position of the LED element 15 in the element mounting area 13 is decided according to the emission brightness of the LED element 15 and is variable as shown in FIGS. 1A to 1C and FIGS. 2A to 2C. The relationship between the emission brightness and the mounting position of the LED element 15 will be described later.

The light emitting device has an encapsulation resin or sealing resin 17. This resin 17 is light-transmissive resin such as silicone resin. The LED element 15 and the bonding wires 16 are buried in the encapsulation resin 17 in an airtight manner, thereby being protected from dust, moisture, vibration, and so on. It should be noted that a fluorescent substance may be added to the encapsulation resin 17 as needed.

Two external terminals 18 are provided on the underside of the substrate 11 such that these external terminals 18 are electrically connected respectively to the n-electrode and the p-electrode of the LED element 15 via conductive vias (not shown). The external terminals 18 serve as electrical and mechanical joints when the light emitting device 1 is placed onto a mounting board.

In FIGS. 2A to 2C, the diffusion range of heat emitted from the LED element 15 is indicated by the broken lines. Heat emitted from the LED element 15 diffuses through the die attach material 14 (AuSn) having relatively high thermal conductivity and the substrate 11 ($Al_2O_3$) having relatively low thermal conductivity toward the placement surface side of the light emitting device 1 at a diffusion angle of about 45° (degrees). The proportion of the volume occupied by the die attach material 14 in this heat diffusion range being larger results in smaller thermal resistance in the heat radiation path, and thus the junction temperature of the LED element 15 during operation is reduced. Because the thickness of the die attach material 14 is different between the flat portion 13A and the recess 13B, the thermal resistance in the heat radiation path of the LED element 15 continuously changes when the LED element mounting position in the element provision area 13 is moved laterally from FIG. 1A to FIG. 1C or vice versa (or from FIG. 2A to FIG. 2C or vice versa).

Specifically, as shown in FIGS. 1A to 1C, when the mounting position of the LED element 15 is moved to the right in the figures, that is, as the area of the overlap between the LED element 15 and the recess 13B becomes larger, that volume of the die attach material 14 which is included in the heat diffusion range increases. Thus, the thermal resistance of the heat radiation path becomes smaller, resulting in a decrease in the junction temperature of the LED element 15 during operation. The die attach material 14 has thermal conductivity different from that of the substrate 11 and therefore functions as a heat transfer member to form uneven thermal resistance distribution in the element mounting area 13. Accordingly, thermal resistance in the heat radiation path through the substrate 11 for heat emitted from the LED element 15 changes with the mounting position of the LED element 15. In general, with a predetermined current, when the junction temperature of an LED element rises, the emission brightness of the LED element drops, and when the junction temperature drops, the emission brightness rises. Hence, in the light emitting device 1 having the above-described configuration, the emission brightness of the LED element 15 can be adjusted by changing the mounting position of the LED element 15.

A manufacturing method of the light emitting device 1 according to Embodiment 1 of the present invention will be described. First, the emission brightness of each of LED elements 15 formed in a wafer is measured under the same conditions, and obtained brightness data is recorded for each LED element. The brightness data is recorded in a storage medium in the form of, for example, mapping data associating it with the position on the wafer of the LED element 15. If the emission brightness distribution of the LED elements in the wafer surface can be predicted to a certain degree, some LED elements may only be sampled to obtain the brightness data without measuring the emission brightness of all the LED elements.

Then, the substrate 11 is prepared. The substrate 11 is made by printing a conductor pattern of the bonding pads 12, the external terminals 18 and other parts on a ceramic green sheet and calcining (sintering or baking) the resultant sheet. The ceramic green sheet has been prepared beforehand by mixing ceramic power and glass in a certain ratio.

Then, the die attach material 14 made of AuSn is coated on the element mounting area 13 of the substrate 11 by, e.g., a dispensing method. The die attach material 14 covers the flat portion 13A and is filled in the recess 13B such that the element mounting surface stretching over the flat portion 13A and the recess 13B becomes flat. The die attach material 14 functions as a heat transfer member to form uneven thermal resistance distribution in the element mounting area 13. As a result, thermal resistance in the heat radiation path for heat emitted from the LED element 15 changes according to the mounting position of the LED element 15.

The LED element 15 is mounted in the element mounting area 13 of the substrate 11 coated with the die attach material 14. The mounting position for the LED element 15 is determined according to the difference between target brightness and actually-measured brightness based on the obtained relationship between the junction temperature and the emission brightness of the LED element 15 and the obtained relationship between the LED element mounting position in the element mounting area 13 and the junction temperature (or thermal resistance).

Specifically, brightness data for the LED element 15 of interest is extracted from the mapping data, and the difference between the actually-measured brightness and the target brightness is obtained. If the actually-measured brightness coincides with the target brightness of the LED element 15, the LED element 15 is mounted at a standard position (or reference position) in the element mounting area 13. The standard position may be the position at which the center line of the mounted LED element 15 lies on the boundary line between the flat portion 13A and the recess 13B (the mounting position shown in FIGS. 1B and 2B). If the actually-measured brightness and the target brightness of the LED element 15 do not coincide, such a junction temperature that the LED element 15 has the target brightness is estimated from the beforehand-obtained relationship between the junction temperature and the emission brightness of the LED element 15. Then, the LED element mounting position in the element mounting area 13 at which the estimated junction temperature is reached when the LED element 15 is operated is derived (calculated) from the beforehand-obtained relationship between the LED element mounting position and the junction temperature (or thermal resistance). If the actually-measured brightness is lower than the target brightness for the LED element 15, the LED element 15 is offset to the recess 13B side from the standard position (FIGS. 1C and 2C). By this offsetting, the area of the overlap between the LED element 15 and the recess 13B increases as compared with the arrangement where the LED element 15 is mounted at the standard position. Accordingly, thermal resistance in the heat radiation path for release of the heat emitted from the LED element 15 becomes lower than in the arrangement where the LED element 15 is mounted at the standard position. This results in the decreased junction temperature of the LED element 15 in operation. Therefore, the emission brightness of the LED element 15 is adjusted to coincide with the target brightness. If the actually-measured brightness of the LED element 15 is higher than the target brightness, the LED element 15 is offset to the flat portion 13A side from the standard position (FIGS. 1A and 2A). By this offsetting, the area of the overlap between the LED element 15 and the recess 13B decreases as compared with the arrangement where the LED element 15 is mounted at the standard position (FIGS. 1B and 2B). The thermal resistance in the heat radiation path for heat emitted from the LED element 15 becomes higher than in the arrangement where the LED element 15 is mounted at the standard position, thereby increasing the junction temperature of the LED element 15 in operation. As a result, the emission brightness of the LED element 15 is adjusted to coincide with the target brightness. In either case, with the larger difference between the target brightness and the actually-measured brightness, the LED element 15 is mounted the larger distance away from the standard position in the element mounting area 13. After the LED element 15 is mounted, the LED element 15 is fixed to the substrate 11 by reflow.

Then, wire bonding is provided to electrically connect the p-electrode and the n-electrode of the LED element 15 to the bonding pads 12.

Finally, the light-transmissive encapsulation resin 17 such as silicone resin is provided over the substrate 11 so that the LED element 15 and the bonding wires 16 are buried in the resin 17. It should be noted that the encapsulation resin 17 may be transparent resin containing a fluorescent substance. The light emitting device 1 is finished by undergoing the above-described steps.

Figure 3:
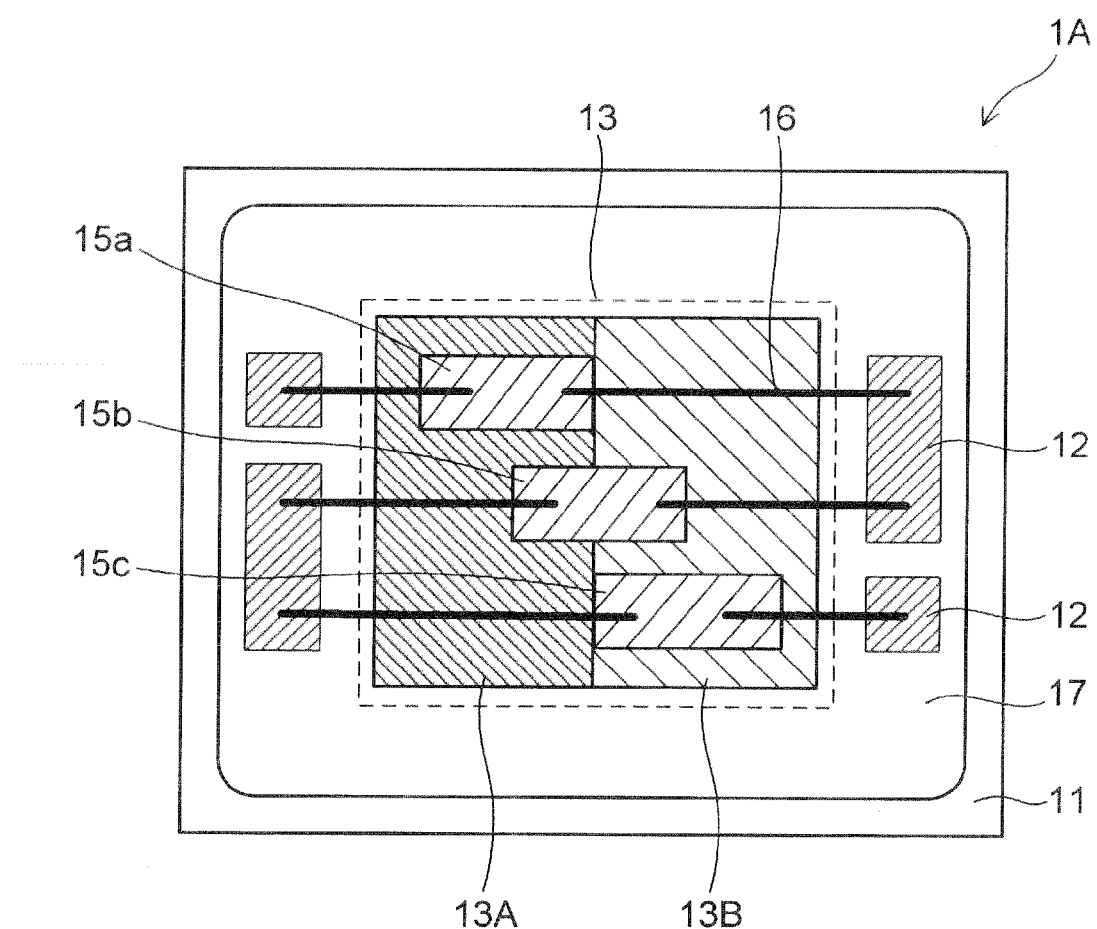
FIG. 3 is a plan view of a light emitting device having a multi-chip configuration according to Embodiment 1 of the present invention.

In the foregoing description, the light emitting device having a single-chip configuration where one LED element 15 is mounted on the element mounting area 13 has been described, but the configuration of the present embodiment can be applied to light emitting devices having a multi-chip configuration. FIG. 3 is a plan view of a light emitting device 1A having a multi-chip configuration where a plurality of LED elements 15a, 15b and 15c are mounted in the element mounting area 13.

For each of the LED elements 15a, 15b and 15c, the mounting position is determined according to the difference between target brightness and actually-measured brightness of the LED concerned, such that the emission brightness and the target brightness of that LED element coincide with each other. The same procedure as in the case of the single-chip configuration is used when determining the respective LED element positions in the multi-chip configuration. Thus, brightness unevenness in the light emitting device 1A is reduced. Variations in brightness among the light emitting devices are also reduced if a plurality of light emitting devices 1A are used collectively.

As to RGB three-in-one packages, target brightness is set for each of red, green, and blue LED elements. For each LED element, the mounting position is determined according to the difference between target brightness and actually-measured brightness. When determining the mounting position, the same procedure as in the case of the single-chip configuration is used. Alternatively, the emission brightness of an LED element mounted at a predetermined position (e.g., the above-mentioned standard position) in the element mounting area 13 may be estimated, and with this estimate as a reference, the target brightness may be set for the other two LED elements such that the emission brightness of the three LED elements takes an appropriate ratio. Then, for each LED element, the mounting position may be determined according to the difference between target brightness and actually-measured brightness with the same procedure as in the case of the single-chip configuration. For RGB three-in-one packages, therefore, variations in emission color as well as variations in brightness between light emitting devices can be suppressed or eliminated. It should be noted that in light emitting devices having a multi-chip configuration, LED elements are preferably connected serially to cause the constant current (or same current) to flow through all the LED elements.

Because the die attach material 14 in the element mounting area 13 of the light emitting device 1 of Embodiment 1 is different in thickness between the flat portion 13A and the recess 13B, the thermal resistance of the heat radiation path for heat emitted from the LED element 15 changes with the mounting position of the LED element 15. Thus, the junction temperature of the LED element 15 in operation changes with the mounting position, and hence the emission brightness of the LED element 15 after packaging can be adjusted by changing the mounting position of the LED element 15. Therefore, by setting the mounting position such that the actual brightness coincides with the target brightness, variations in brightness and/or emission color between light emitting devices can be reduced, and brightness unevenness in a light emitting device due to variations in brightness between LED elements can also be reduced.

Although in the above-described embodiment $Al_2O_3$ is used as the material for the substrate 11, other ceramic such as AlN, or material other than ceramic such as glass epoxy resin can be used. For the material of the die attach material 14, Ag paste, a silicone adhesive or the like can be used instead of AuSn. Although in the foregoing description the thermal conductivity of the die attach material 14 is higher than that of the substrate 11, the thermal conductivity of the substrate 11 may be higher than that of the die attach material 14. For example, AlN (thermal conductivity: 170 W/m·k) may be used as material for the substrate 11, and Ag paste (3 W/m·k) or a silicone adhesive (0.2 W/m·k) may be used as material for the die attach material 14. In this case, the mounting position of the LED element 15 when the emission brightness of the LED element 15 does not coincide with the target brightness is opposite the above-described example. Specifically, if the actually-measured brightness of the LED element 15 is lower than the target brightness, the LED element 15 is offset to the flat portion 13A side from the standard position. This decreases the area of the overlap between the LED element 15 and the recess 13B, and in turn reduces thermal resistance. On the other hand, if the actually-measured brightness of the LED element 15 is higher than the target brightness, the LED element 15 is offset to the recess 13B side from the standard position. This increases the area of the overlap between the LED element 15 and the recess 13B and in turn increases the thermal resistance.

Embodiment 2

Figure 4A:
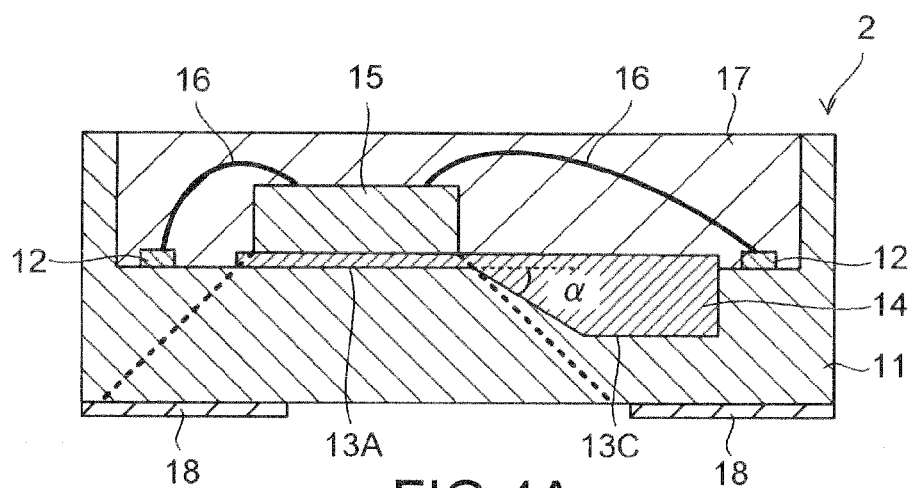
FIG. 4A is a cross-sectional view of a light emitting device according to Embodiment 2 of the present invention.
Figure 4B:
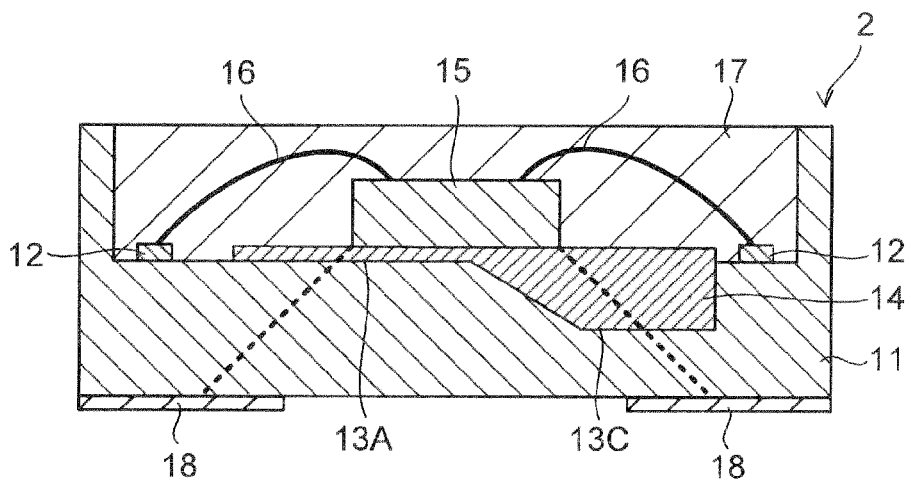
FIG. 4B is a cross-sectional view of another light emitting device according to Embodiment 2 of the present invention.
Figure 4C:
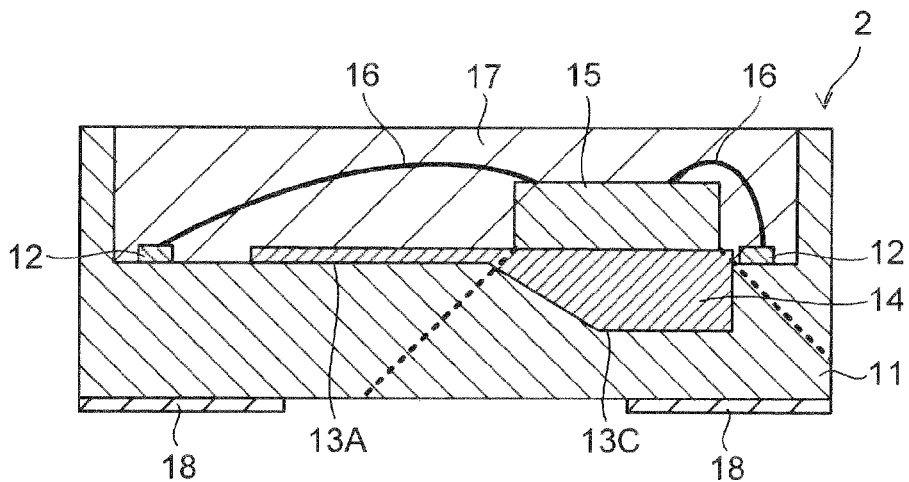
FIG. 4C is a cross-sectional view of still another light emitting device according to Embodiment 2 of the present invention.

A light emitting device 2 according to Embodiment 2 of the present invention will be described below with reference to FIG. 4A to FIG. 4C. FIGS. 4A to 4C are cross-sectional views showing the configuration of the light emitting device 2. The light emitting device 2 of Embodiment 2 is similar to the light emitting device 1 of Embodiment 1 in that the element mounting area 13 has a flat portion and a recess, but differs from Embodiment 1 in the configuration of the recess. The light emitting device 2 has a unique recess 13C in Embodiment 2. Similar reference numerals and symbols are used to designate similar parts and elements in Embodiments 1 and 2.

The recess 13C is adjacent to the flat portion 13A and has a side surface (lateral wall) sloping from the principal surface of the substrate 11 toward the bottom of the recess 13C. That is, the cross-sectional shape of the recess 13C is trapezoidal as shown in FIGS. 4A to 4C. This sloping surface has an inclination angle $\alpha$ (alpha) that is less than 45° (45 degrees). By configuring the recess 13C in this way, the range of thermal resistance adjustment by changing the LED element mounting position is enlarged as compared with Embodiment 1, and accordingly the range of emission brightness adjustment of the LED element 15 is also enlarged.

In FIGS. 4A to 4C, the diffusion range of heat emitted from the LED element 15 is indicated by the broken lines. Heat emitted from the LED element 15 diffuses through the die attach material 14 (AuSn) having relatively high thermal conductivity and the substrate 11 ($Al_2O_3$) having relatively low thermal conductivity toward the placement surface of the light emitting device 2 at an oblique diffusion angle of about 45°. The volume occupied by the die attach material 14 in this heat diffusion range being larger results in smaller thermal resistance in the heat radiation path, and thus the junction temperature of the LED element 15 in operation is reduced. Because the recess 13C has the inclined surface with the angle $\alpha$ (less than 45°), the diffusion range of heat emitted from the LED element 15 does not include that portion of the die attach material 14 which fills the recess 13C if the LED element 15 is mounted on the flat portion 13A without overlapping the recess 13C as shown in FIG. 4A. Heat emitted from the LED element 15 is radiated through only the thinnest portion of the die attach material 14 toward the placement surface of the light emitting device. Hence, the thermal resistance of the heat radiation path is higher than in the case shown in FIG. 2A (Embodiment 1), and thus the adjustment range of emission brightness of the LED element 15 is enlarged. Although in the foregoing description the thermal conductivity of the die attach material 14 is higher than that of the substrate 11, the thermal conductivity of the substrate 11 may be higher than that of the die attach material 14. In this case, as the volume occupied by the die attach material 14 in the heat diffusion range becomes smaller, thermal resistance in the heat radiation path becomes smaller, and thus the junction temperature of the LED element 15 in operation decreases.

Embodiment 3

Figure 5A:
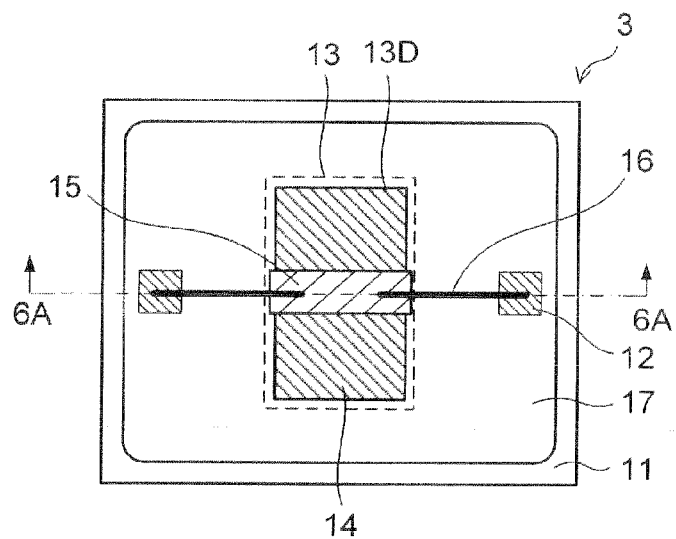
FIG. 5A is a plan view of a light emitting device having a single-chip configuration according to Embodiment 3 of the present invention.
Figure 5B:
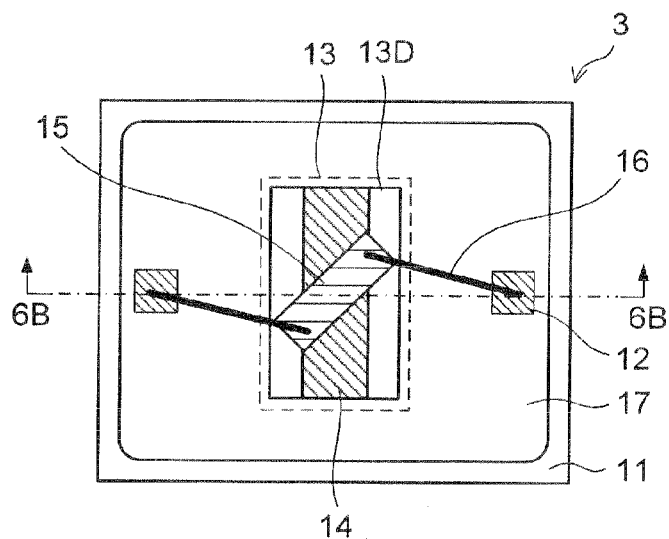
FIG. 5B is similar to FIG. 5A and shows a modified light emitting device having the single-chip configuration according to Embodiment 3 of the present invention.
Figure 5C:
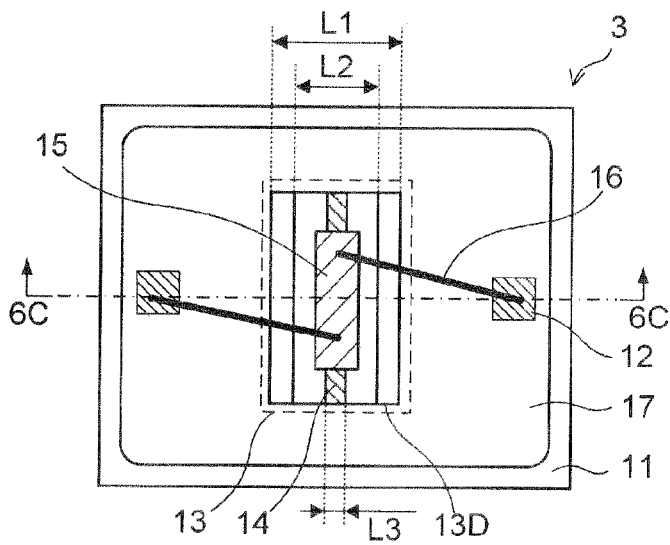
FIG. 5C is also similar to FIG. 5A and shows another modified light emitting device having the single-chip configuration according to Embodiment 3 of the present invention.
Figure 6A:
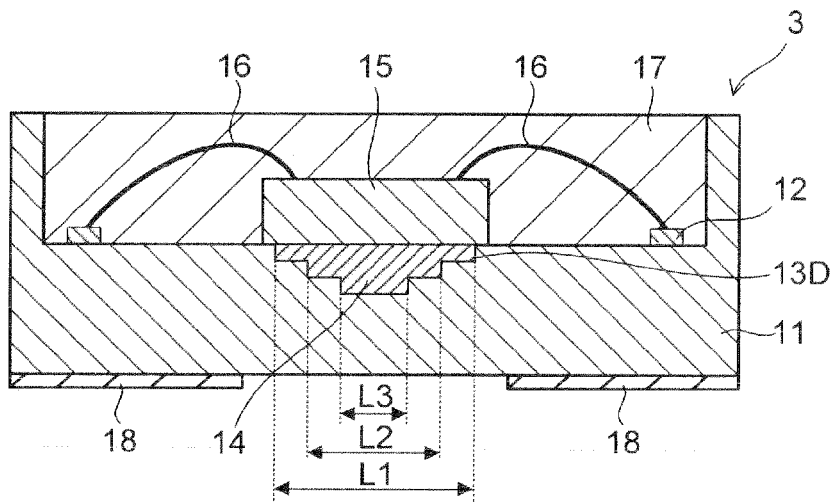
FIG. 6A is a cross-sectional view taken along the line 6A-6A in FIG. 5A.
Figure 6B:
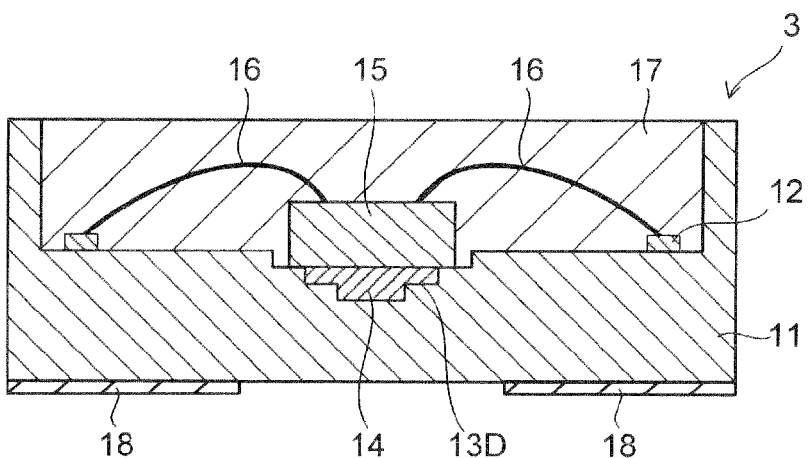
FIG. 6B is a cross-sectional view taken along the line 6B-6B in FIG. 5B.
Figure 6C:
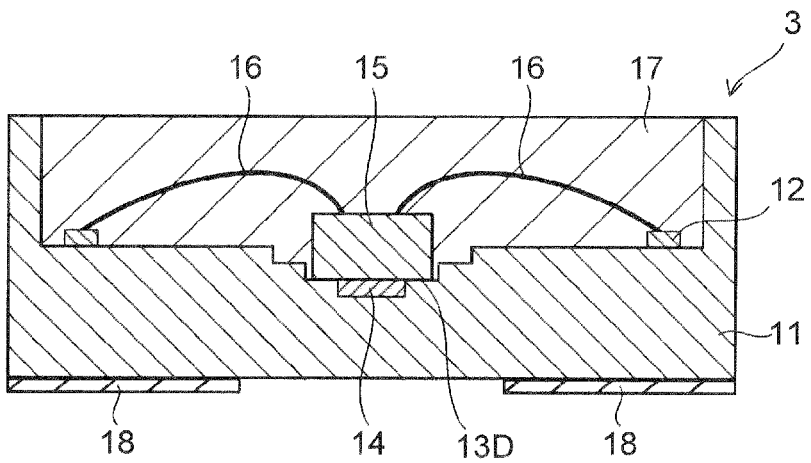
FIG. 6C is a cross-sectional view taken along the line 6C-6C in FIG. 5C.

A light emitting device 3 according to Embodiment 3 of the present invention will be described below with reference to FIGS. 5A to 5C and FIGS. 6A to 6C. FIGS. 5A to 5C are plan views of the light emitting device 3 according to Embodiment 3 as viewed from the light emission surface side, and FIGS. 6A to 6C are cross-sectional views taken along the lines 6A-6A, 6B-6B and 6C-6C in FIGS. 5A, 5B and 5C, respectively. Similar reference numerals and symbols are used in Embodiments 1 and 3.

The light emitting device 3 according to Embodiment 3 differs from the light emitting device 1 according to Embodiment 1 in the configuration of the substrate 11. The configurations of the other parts are the same as those of the light emitting device 1 of Embodiment 1.

The substrate 11 is made of ceramic such as $Al_2O_3$, and has an element mounting area 13 in an element mounting surface of the substrate 11. Bonding pads 12 are provided on the element mounting surface. The element mounting area 13 has a recess 13D constituted by a stairs-like groove. The recess 13D deepens stepwise when going toward the center or it can be said that the recess 13D is a combination of symmetrical downstairs. The stairs-like groove 13D includes three sub-grooves. Specifically, the recess 13D includes an upper sub-groove, middle sub-groove and lower sub-groove which are sequentially made smaller in width. The width L1 of the upper sub-groove of the recess 13D is slightly shorter than the long side of the LED element 15 and longer than the short side. The width L3 of the lower sub-groove of the recess 13D is shorter than the short side of the LED element 15. The width L2 of the middle sub-groove of the recess 13D is between the width L1 and width L3.

The die attach material 14 is made of Ag paste or the like, and fills the recess 13D. The amount of the die attach material 14 in the recess 13D is determined according to the mounting angle of the LED element 15 as shown in FIGS. 5A-5C and FIGS. 6A-6C. The mounting angle of the LED element 15 in the element mounting area 13 is determined according to the actually-measured brightness of the LED element 15.

The LED element 15 is in a rectangular shape having a long side longer than the width L1 of the upper sub-groove and a short side shorter than the width L1 of the upper sub-groove and the width L2 of the middle sub-groove and longer than the width L3 of the lower sub-groove. The LED element 15 is mounted on the substrate 11 in such a way as to straddle or span one of the upper, middle and lower sub-grooves.

FIG. 5A shows one possible arrangement where the LED element 15 is mounted such that its long side perpendicularly crosses the groove or recess 13D in the element mounting area 13. In this case, the die attach material 14 is supplied to completely fill the stairs-like groove 13D, as shown in FIG. 6A. The surface of the die attach material 14 is coplanar to the element mounting surface of the substrate 11. The LED element 15 is mounted on the element mounting surface of the substrate 11 such that its long side extends over the upper sub-groove of the recess 13D. For example, if the LED element 15 is mounted as shown in FIG. 6A using a die attach material whose thermal conductivity is lower than that of the substrate 11, the thickness of the substrate 11 under the LED element 15 takes the maximum value. Thus, the thermal resistance in the heat radiation path for heat emitted from the LED element 15 becomes the largest.

FIG. 5C shows another possible arrangement where the LED element 15 is mounted with its long side being parallel to the recess 13D in the element mounting area 13. In this case, the die attach material 14 is supplied to fill only the lower sub-groove of the recess 13D, as shown in FIG. 6C, and the LED element 15 is mounted in the middle sub-groove with its short side extending over the lower sub-groove of the recess 13D. If the LED element 15 is mounted as shown in FIG. 6C using a die attach material whose thermal conductivity is lower than that of the substrate 11, the thickness of the substrate 11 under the LED element 15 takes the smallest value. Thus, the thermal resistance in the heat radiation path for heat emitted from the LED element 15 becomes the smallest.

FIG. 5B shows still another arrangement where the LED element 15 is mounted with its long side being oriented at a certain angle (e.g., 45°) with respect to the recess 13D in the element mounting area 13. In this case, the die attach material 14 is supplied to fill the lower and middle sub-grooves of the recess 13D as shown in FIG. 6B, and the LED element 15 is mounted in the upper sub-groove such that its long side extends over the middle sub-groove of the recess 13D. If the LED element 15 is mounted as shown in FIG. 5B and a die attach material has a thermal conductivity lower than that of the substrate 11, then the thermal resistance in the heat radiation path for heat emitted from the LED element 15 is between the value of the arrangement shown in FIG. 5A and the value of the arrangement shown in FIG. 5C.

Next, a manufacturing method of the light emitting device 3 according to Embodiment 3 of the present invention will be described. First, the brightness of each of LED elements 15 formed in a wafer is measured under the same conditions, and the obtained brightness data is recorded for each LED element 15. The brightness data is recorded in a storage medium in the form of, e.g., mapping data associating the brightness with the LED element position on the wafer. If the brightness distribution of the LED elements on the wafer surface can be predicted to a certain degree, some LED elements may only be sampled without measuring the brightness of all the LED elements.

Then, the substrate 11 is prepared. The substrate 11 is made by printing a conductor pattern of the bonding pads 12 and the external terminals 18 on a ceramic green sheet and baking (sintering) the resulting sheet. The ceramic green sheet is obtained by mixing ceramic powder and glass in a certain ratio.

Then, the amount of the die attach material 14 to be filled in the recess 13D and the mounting angle of the LED element 15 with respect to the substrate 11 are determined according to the measured emission brightness of the LED element 15, and the LED element 15 is mounted on the substrate 11. The mounting angle of the LED element 15 is determined according to the difference between the target brightness and actually-measured brightness of the LED element 15. Specifically, brightness data for the LED element 15 is extracted from the mapping data to obtain the difference between its actually-measured brightness and target brightness. If the actually-measured brightness of the LED element 15 is greater, e.g., 20%, than the target brightness, then the LED element 15 is mounted, using a die attach material whose thermal conductivity is lower than that of the substrate 11, at such a mounting angle that its long side perpendicularly crosses the groove 13D as shown in FIG. 5A. In this case, the die attach material 14 is supplied to fill the entire groove 13D (from the lower sub-groove to the upper sub-groove of the groove 13D). If the actually-measured brightness of the LED element 15 is within, e.g., plus or minus 20% of the target brightness, then the LED element 15 is mounted, using a die attach material whose thermal conductivity is lower than that of the substrate 11, at such a mounting angle that its long side is oriented at a certain angle with respect to the substrate 11 as shown in FIG. 5B. In this case, the die attach material 14 is supplied to fill the lower and middle sub-grooves of the groove 13D. If the actually-measured brightness of the LED element 15 is 20% lower than the target brightness, then the LED element 15 is mounted, using a die attach material whose thermal conductivity is lower than that of the substrate 11, at such a mounting angle that its long side is parallel to the groove of the groove 13D as shown in FIG. 5C. In this case, the die attach material 14 is supplied to fill only the lower sub-groove of the groove 13D. As such, by setting the amount of the die attach material 14 to be filled in the recess 13D and the mounting angle of the LED element 15 according to the actually-measured value of the emission brightness of the LED element 15, the emission brightness of the LED element 15 in operation is adjusted to be the same between light emitting devices. It should be noted that by changing the mounting angle of the LED element 15 within the range from the one shown in FIG. 5A to the one shown in FIG. 5C gradually, the emission brightness of the LED element 15 can be finely adjusted.

After mounted in the element mounting area 13, the LED element 15 is provided on the substrate 11 by reflow.

Then, the p-electrode and the n-electrode of the LED element 15 are electrically connected to the bonding pads 12 by wire bonding.

Finally, the light-transmissive encapsulation resin 17 such as silicone resin is filled on the substrate 11 so that the LED element 15 and the bonding wires 16 are buried. It should be noted that the encapsulation resin 17 may be transparent resin containing a fluorescent substance. The light emitting device 3 is finished by undergoing the above-described steps.

Figure 7:
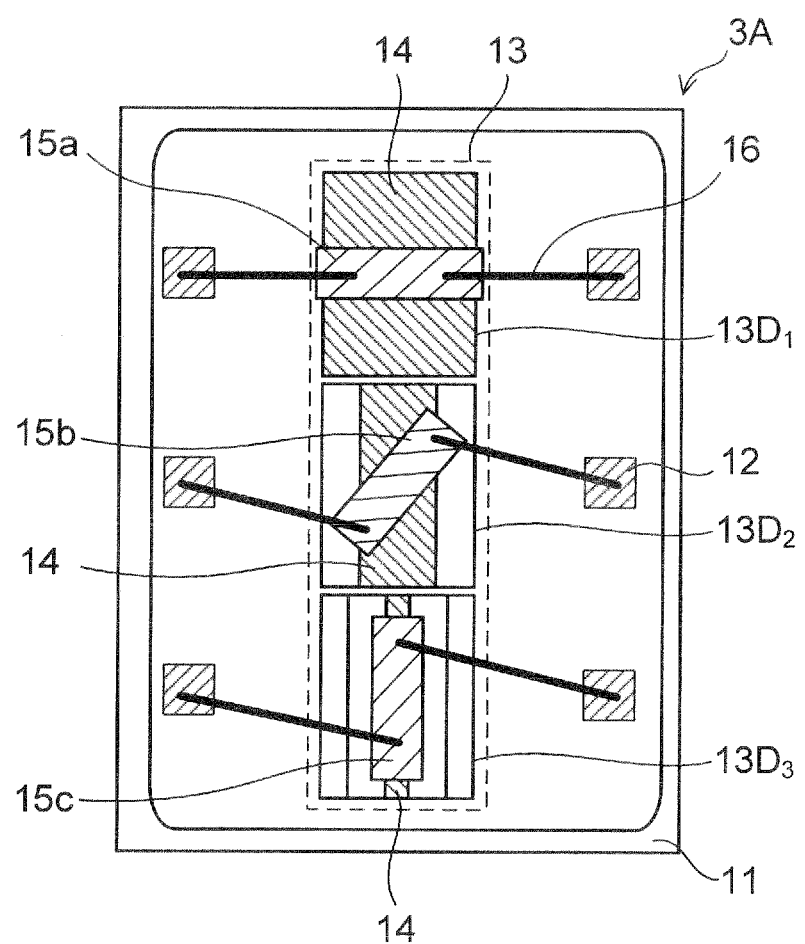
FIG. 7 is a plan view of a light emitting device having a multi-chip configuration according to Embodiment 3 of the present invention.

Although the foregoing description has been made to the light emitting device of the single-chip configuration, the configuration of the present embodiment may be applied to light emitting devices of a multi-chip configuration. FIG. 7 illustrates a plan view of a light emitting device 3A that has the multi-chip configuration where a plurality of LED elements 15a, 15b and 15c are mounted in the element mounting area 13. The light emitting device 3A possesses, for example, three LED elements 15a to 15c. Three separate recesses $13D_1$, $13D_2$, $13D_3$ are formed in the element mounting area 13 corresponding to the three LED elements 15a to 15c, respectively. The LED elements 15a to 15c have, for example, the same emission color. The mounting angles and the amounts of the die attach materials 14 for the three LED elements 15a to 15c are determined such that these LED elements 15a to 15c have the same emission brightness. Specifically, the mounting angles and the amounts of the die attach materials 14 for the LED elements 15a to 15c are set such that the emission brightness of all the LED elements 15a to 15c coincide with the target brightness. The procedure of setting the mounting angles and the amounts of the die attach material 14 for the LED elements 15a to 15c are the same as in the case of the single-chip configuration. By configuring the light emitting device 3A in this way, variations in brightness between light emitting devices can be reduced, and brightness unevenness in the light emitting device can also be reduced.

As described above, the light emitting device 3 according to Embodiment 3 has the recess 13D constituted by the stairs-like groove in the element mounting area 13, and a different amount (adjusted amount) of the die attach material 14 depending on the mounting angle of the LED element 15 is filled in the recess 13D. The recess 13D is structured such that when the mounting angle of the LED element 15 is changed, the thickness of the substrate 11 under the LED element 15 changes. The thermal resistance in the heat radiation path for heat emitted from the LED element 15 changes with the mounting angle of the LED element 15. Because the junction temperature of the LED element 15 in operation changes according to the filling amount of the die attach material 14 and the mounting angle of the LED element 15, the emission brightness of the LED element 15 after packaging can be adjusted by changing the filling amount of the die attach material 14 and the mounting angle of the LED element 15. Therefore, by setting the filling amount of the die attach material 14 and the mounting angle of the LED element 15 such that the actual brightness coincides with the target brightness, variations in brightness or emission color between light emitting devices, or brightness unevenness in the light emitting device due to variations in brightness between LED elements can be reduced.

Embodiment 4

Figure 8A:
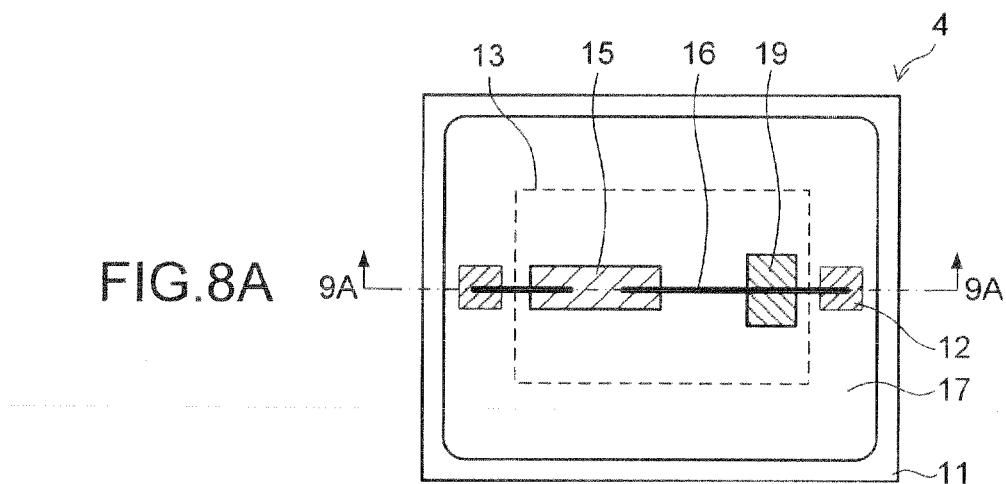
FIG. 8A is a plan view of a light emitting device according to Embodiment 4 of the present invention.
Figure 8B:
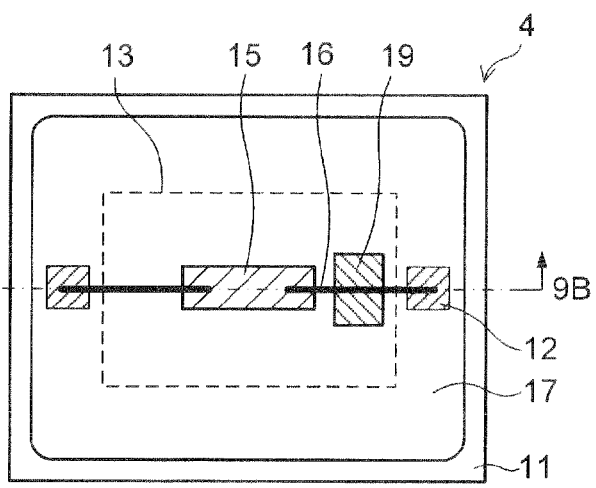
FIG. 8B is similar to FIG. 8A and shows another light emitting device according to Embodiment 4 of the present invention.
Figure 8C:
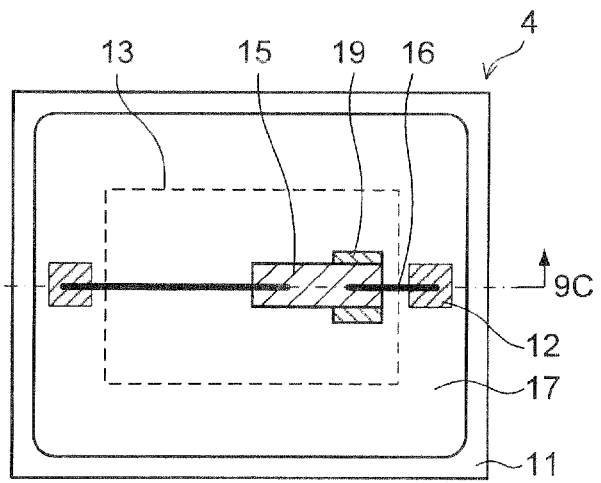
FIG. 8C is also similar to FIG. 8A and illustrates still another light emitting device according to Embodiment 4 of the present invention.
Figure 9A:
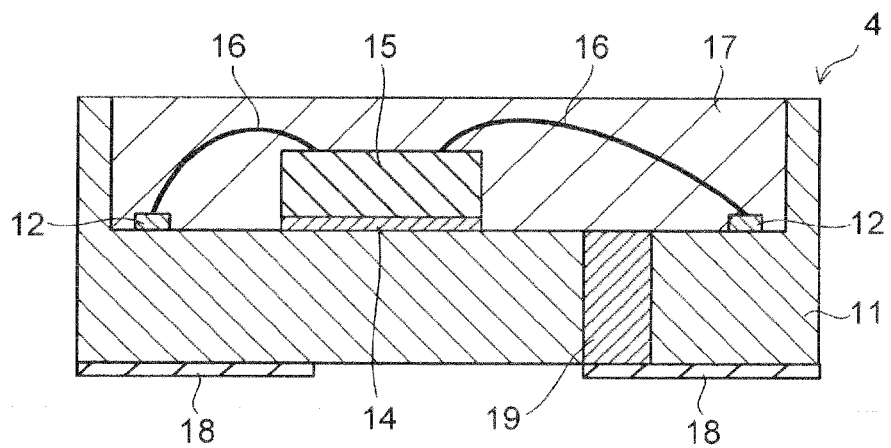
FIG. 9A is a cross-sectional view taken along the line 9A-9A in FIG. 8A.
Figure 9B:
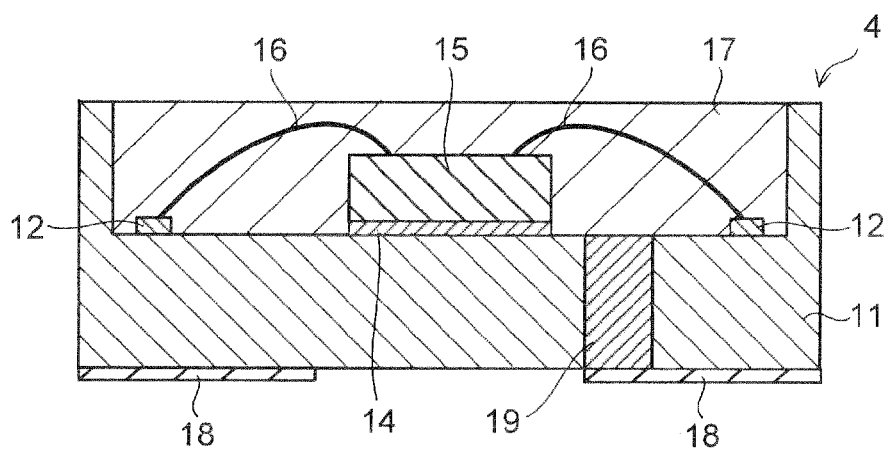
FIG. 9B is a cross-sectional view taken along the line 9B-9B in FIG. 8B.
Figure 9C:
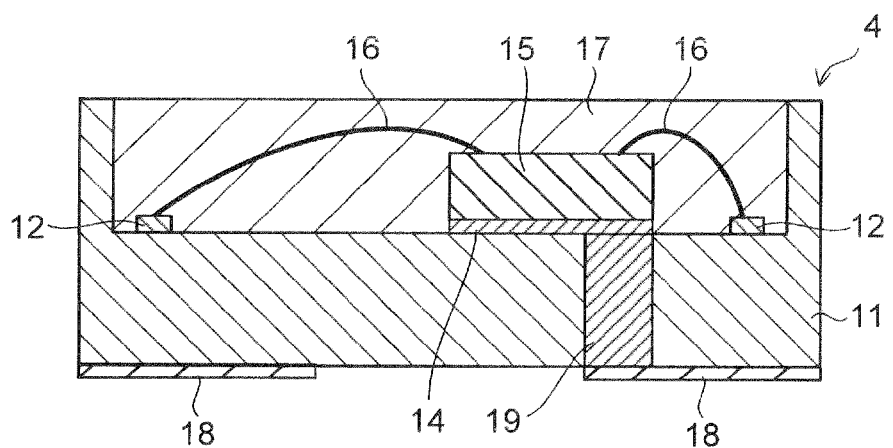
FIG. 9C is a cross-sectional view taken along the line 9C-9C in FIG. 8C.

A light emitting device 4 according to Embodiment 4 of the present invention will be described below with reference to FIGS. 8A to 8C and FIGS. 9A to 9C. FIGS. 8A to 8C are plan views of the light emitting device 4 according to Embodiment 4 as viewed from the light emission surface side. Similar reference numerals are used to designate to similar elements and parts in Embodiments 1 and 4.

The light emitting device 4 according to Embodiment 4 has a thermal via 19 extending in the element mounting area 13 from the element mounting surface (principal surface) to the underside of the substrate 11. The thermal via 19 is made from, e.g., Cu or Ag, and has higher thermal conductivity than $Al_2O_3$. The substrate 11 is made from $Al_2O_3$. The thermal via 19 may be provided at a desired position in the element mounting area 13. In the illustrated embodiment, the thermal via 19 is provided near an outer boundary of the element mounting area 13 or away from the center of the element mounting area 13. The LED element 15 is provided onto the substrate 11 via the die attach material 14 in the element mounting area 13. The LED element 15 is electrically connected to the bonding pads 12 via bonding wires 16.

In the light emitting device 4, as shown in FIGS. 8A to 8C and FIGS. 9A to 9C, either the distance between the LED element 15 and the thermal via 19 or the area of the overlap between the LED element 15 and the thermal via 19 is changed, in order to change the thermal resistance in the heat radiation path for heat from the LED element 15. The changing of the thermal resistance results in the adjusting of the junction temperature of the LED element 15 and the adjusting of the emission brightness of the LED element 15.

As described above, heat emitted from the LED element 15 diffuses toward the placement surface of the light emitting device 4 at an oblique angle of about 45°. Thus, the volume of that part of the thermal via 19 which is included in the heat diffusion range changes with the mounting position of the LED element 15, and hence thermal resistance in the heat radiation path for the LED element 15 changes. Specifically, as shown in FIGS. 8A to 8C, when the mounting position of the LED element 15 is moved to the right in the figure, that is, when the distance between the LED element 15 and the thermal via 19 is reduced, the volume of the thermal via 19 included in the heat diffusion range increases. Thus, thermal resistance in the heat radiation path for the LED element 15 decreases, and as a result the junction temperature of the LED element 15 in operation drops. In general, with a predetermined current, when the junction temperature of the LED element rises, the emission brightness of the LED element decreases, and when the junction temperature decreases, the emission brightness increases. Therefore, in the light emitting device 4 having the above-described configuration, the brightness of the LED element 15 can be adjusted by changing the mounting position of the LED element 15.

As such, according to the light emitting device 4 according to Embodiment 4, the thermal via 19 is formed in a specific place in the element mounting area 13 of the substrate 11, and hence thermal resistance in the radiation path for heat emitted from the LED element 15 changes with the mounting position of the LED element 15. Thus, the junction temperature of the LED element 15 during operation changes with the mounting position of the LED element 15, and hence the emission brightness of the LED element 15 after packaging can be adjusted by changing the mounting position of the LED element 15. Therefore, by setting the mounting position such that the actual brightness coincides with the target brightness, variations in brightness or emission color between light emitting devices, or brightness unevenness in the light emitting device due to variations in brightness between LED elements can be reduced.

The present invention has been described above with reference to preferred embodiments. It should be understood that those skilled in the art may be able to make various modifications and changes to the described and/or illustrated embodiments without departing from the spirit and scope of the present invention, and that all such modifications and changes fall within the scope of the present invention as defined by the appended claims.

This application is based on Japanese Patent Application No. 2010-111302 filed on May 13, 2010, and the entire disclosure thereof is incorporated herein by reference.

What is claimed is:

1. A light emitting device comprising:
a substrate having an element mounting area in a principal surface of said substrate, said substrate having a flat portion and a recess formed in said principal surface of said substrate, and said flat portion being adjacent to said recess;
at least one light emitting element mounted in said element mounting area of said substrate,
a heat radiation path extending through said substrate for release of heat emitted from said light emitting element, said heat radiation path having a thermal resistance that changes with a mounting position of said light emitting element; and
a heat transfer member provided on said substrate and having a thermal conductivity different from a thermal conductivity of said substrate, said heat transfer member being configured to provide an uneven thermal resistance distribution in said element mounting area,
wherein:
said heat transfer member comprises a one-piece element and covers both of said flat portion and said recess;
a thickness of said heat transfer member on the flat portion is less than a thickness of said heat transfer member in the recess;
a top surface of said heat transfer member is flat in said element mounting area;
said element mounting area has a size such that the light emitting element is mountable on any one of (i) said flat portion only, (ii) a border between the flat portion and the recess, and (iii) said recess only; and
the mounting position of the light emitting element is determined based on at least one of (i) a relationship between a junction temperature and an emission brightness of said light emitting element and a relationship between the mounting position of said light emitting element and the junction temperature of said light emitting element, and (ii) a relationship between the junction temperature and the emission brightness of said light emitting element and a relationship between the mounting position of said light emitting element and the thermal resistance of said heat radiation path.

2. The light emitting device according to claim 1, wherein a volume of said heat transfer member which is included in said heat radiation path changes with the mounting position of said light emitting element.

3. The light emitting device according to claim 1, wherein said heat transfer member comprises a die attach material and said light emitting element is provided on said substrate via said die attach material.

4. The light emitting device according to claim 3, wherein a side surface of said recess which is adjacent to said flat portion slopes from said principal surface of said substrate toward a bottom of said recess, and an inclination angle of said side surface with respect to said principal surface of said substrate is less than 45 degrees.

5. The light emitting device according to claim 1, wherein said at least one light emitting element includes a plurality of light emitting elements, and each of said plurality of light emitting elements is mounted at a respective position in said element mounting area.

6. The light emitting device according to claim 1, wherein the thermal conductivity of said heat transfer member is higher than the thermal conductivity of said substrate.

7. The light emitting device according to claim 1, wherein the thermal conductivity of said heat transfer member is lower than the thermal conductivity of said substrate.

8. The light emitting device according to claim 1, further comprising a bonding pad situated in a vicinity of the element mounting area, the light emitting element being connected to the bonding pad by wire bonding.

* * * * *